(12) United States Patent
Lin et al.

(10) Patent No.: US 7,505,342 B2
(45) Date of Patent: Mar. 17, 2009

(54) MEMORY BUS OUTPUT DRIVER OF A MULTI-BANK MEMORY DEVICE AND METHOD THEREFOR

(75) Inventors: Jentsung Lin, Cardiff by the Sea, CA (US); Ajay Anant Ingle, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/554,522

(22) Filed: Oct. 30, 2006

(65) Prior Publication Data

US 2008/0112243 A1    May 15, 2008

(51) Int. Cl.
G11C 7/00    (2006.01)
(52) U.S. Cl. ............... 365/205; 365/189.17; 365/230.03
(58) Field of Classification Search ............ 365/189.17, 365/205, 230.03
See application file for complete search history.

(56) References Cited

U.S. PATENT DOCUMENTS

| | | | |
|---|---|---|---|
| 5,185,744 A | 2/1993 | Arimoto et al. | |
| 5,668,482 A | 9/1997 | Roskell | |
| 5,680,365 A | 10/1997 | Blankenship | |
| 6,148,413 A * | 11/2000 | Pascucci et al. | 714/8 |
| 6,163,863 A | 12/2000 | Schicht | |
| 6,378,008 B1 * | 4/2002 | Gradinariu | 710/7 |
| 6,449,196 B2 * | 9/2002 | Fujimoto | 365/189.15 |
| 6,487,688 B1 | 11/2002 | Nadeau-Dostie | |
| 6,597,621 B2 | 7/2003 | Tsuji et al. | |
| 6,642,749 B1 * | 11/2003 | Wu et al. | 327/55 |
| 6,822,439 B2 | 11/2004 | Kodihalli et al. | |
| 7,234,089 B2 | 6/2007 | Morton | |
| 2002/0031035 A1 | 3/2002 | Tsuji et al. | |
| 2003/0093732 A1 | 5/2003 | Morton | |
| 2004/0153929 A1 | 8/2004 | Kodihalli | |

OTHER PUBLICATIONS

International Search Report - PCT/US07/082824, International Search Authority - European Patent Office, Oct. 22, 2008.
Written Opinion - PCT/US07/082824, International Search Authority - European Patent Office, Oct. 22, 2008.

\* cited by examiner

*Primary Examiner*—Hoai V Ho
(74) *Attorney, Agent, or Firm*—Nicholas J. Pauley; Sam Talpalatsky; John L. Ciccozzi (57) ABSTRACT

In a particular embodiment, a method is disclosed that includes receiving a first sense output and a second sense output of a sense amplifier at a first tri-state device coupled to a first bus, receiving the first sense output and the second sense output of the sense amplifier at a second tri-state device coupled to a second bus, and selectively activating one of the first tri-state device and the second tri-state device to drive the first bus or the second bus in response to a bus selection input.

14 Claims, 9 Drawing Sheets

MEMORY BUS OUTPUT DRIVER OF A MULTI-BANK MEMORY DEVICE AND METHOD THEREFOR

BACKGROUND

I. Field

The present disclosure generally relates to memory arrays, and more particularly, to methods and devices including at least one memory bus.

II. Description of Related Art

In general, memory devices may include multiple banks of memory arrays. To access data stored in one of the multiple memory banks, a selected memory bank may be activated to provide a data signal to a multiplexer, which may be a static or a dynamic multiplexer. Each memory bank may provide one or more outputs to the multiplexer. A control device may provide a control signal to the multiplexer to select an output of the selected memory bank. However, if the multiplexer is a static multiplexer, then transistor gate loading for the selected line of each memory array is increased. If the multiplexer is a dynamic multiplexer, the multiplexer may increase clock loading.

In conventional devices, testing an output bus of a memory bank may add timing delays or undesired power consumption. Moreover, adding automatic test pattern generation data to the output bus of a particular memory bank of a multi-bank memory device may add complexity. Hence, there is a need for an improved memory bus output driver.

SUMMARY

In a particular embodiment, a method is disclosed that includes receiving a first sense output and a second sense output of a sense amplifier at a first tri-state device coupled to a first bus, receiving the first sense output and the second sense output of the sense amplifier at a second tri-state device coupled to a second bus, and selectively activating either the first tri-state device or the second tri-state device to drive the first bus or the second bus in response to a bus selection input.

In another particular embodiment, a circuit device includes a first tri-state device coupled to a first bus, a second tri-state device coupled to a second bus, and a sense amplifier responsive to a first and second bit line of a memory array. The sense amplifier includes a first output and a second output coupled to the first tri-state device and the second tri-state device, respectively. The sense amplifier selectively drives either the first bus or the second bus.

In yet another particular embodiment, a system is provided that includes a memory array, an output bus responsive to the memory array, and a test structure coupled to the output bus to test the output bus without activating the memory array. The test structure includes a bank enable input, a test enable input, a logic gate, a first transistor and a second transistor. The logic gate includes a first input coupled to the bank enable input, a second input coupled to the test enable input, and a logic output. The first transistor includes a first power terminal coupled to a first power supply terminal, a first control terminal coupled to the bank enable input, and a first output terminal coupled to the output bus. The second transistor includes a second output terminal coupled to the output bus, a second control terminal coupled to the logic output, and a second power terminal coupled to a second power supply terminal.

In still another particular embodiment, a device is provided that includes a plurality of memory buses, a data bus, and logic. Each of the plurality of memory buses is coupled to a respective memory bank. The logic selectively couples a selected one of the plurality of memory buses to the data bus without using a multiplexer. In a particular illustrative embodiment, the logic includes an AND gate. In another particular embodiment, the logic may include a NAND gate and an inverter. One particular advantage of a particular illustrative embodiment is that using an AND gate or a NAND gate with an inverter to select between memory banks improves read access timing. Another advantage of a particular illustrative embodiment is that design complexity is reduced, since the routing associated with a multiplexer bank selection is eliminated.

Yet another advantage of a particular illustrative embodiment is provided in that automatic test pattern generation coverage may be increased to test memory bank outputs without introducing undesired timing delays.

Still another advantage of a particular illustrative embodiment is provided in that multi-thread access may be supported without adding extra sense-amplifiers, since the dual outputs of the sense amplifiers may be utilized to drive dual buses, which supports a two-thread memory access.

Another advantage of a particular illustrative embodiment is provided in that the output behavior of a sense amplifier may be utilized to create a push-pull type of tri-state bus. A default pull-up device may be added to each tri-state bus to hold a voltage on each bus at a particular voltage level, such as a logic high voltage level, when the bank is inactive, allowing the output selection between buses to be performed using a single logic gate, rather than a multiplexer.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following Detailed Description when taken in conjunction with the accompanying Drawings wherein.

DETAILED DESCRIPTION

Figure 1:
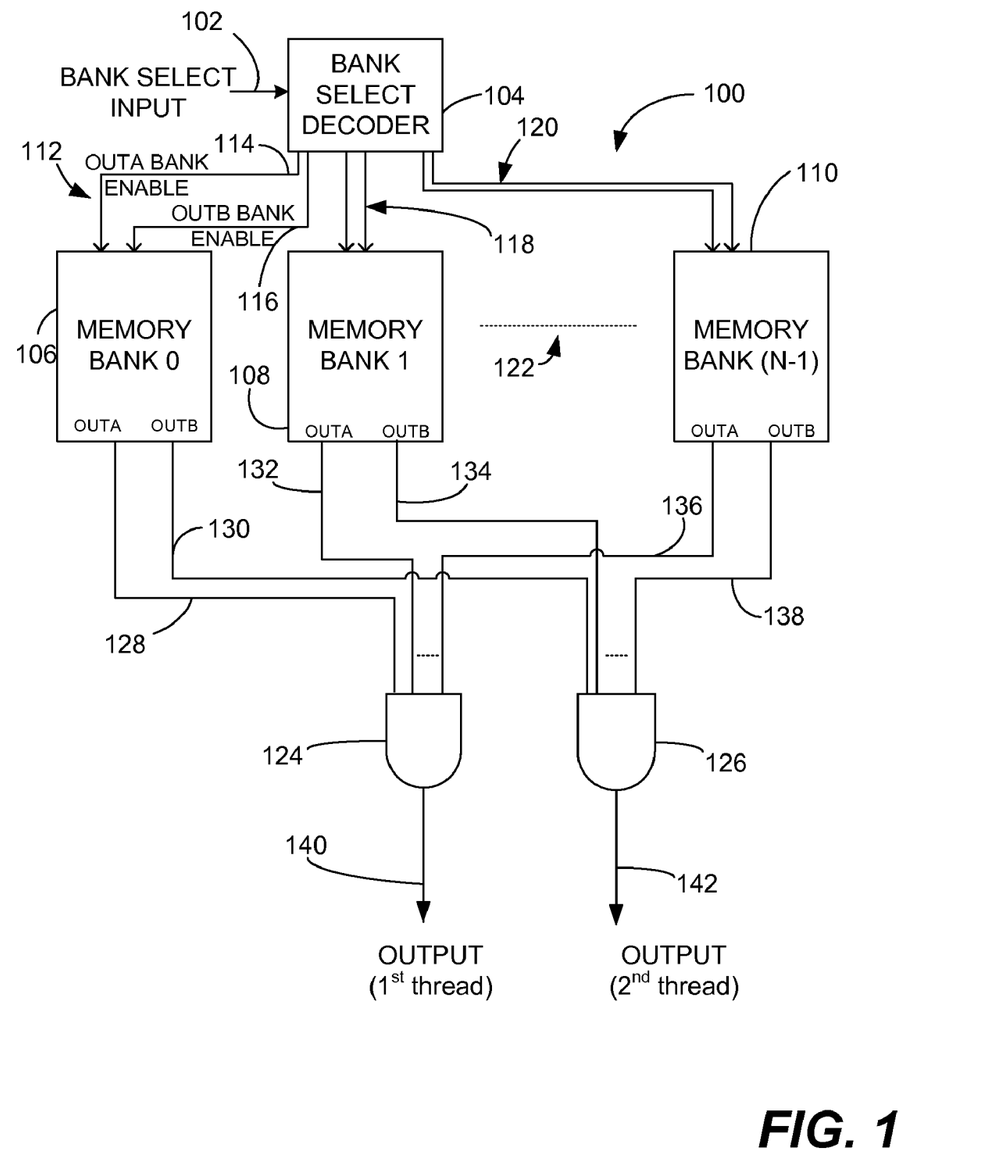
FIG. 1 is a block diagram of a particular illustrative embodiment of a memory device including multiple memory banks and logic to select between the outputs of the multiple memory banks.

FIG. 1 is a block diagram of a particular illustrative embodiment of a memory device 100 that includes multiple memory banks and logic to select between the memory banks and to select between memory bank outputs. The memory device 100 includes a bank select input 102, multiple memory banks (memory bank 0, memory bank 1, and memory bank N-1) 106, 108, and 110, and logic, such as the bank select decoder 104, to select between the memory banks 106, 108 and 110. The memory bank (memory bank 0) 106 is coupled to the bank select decoder 104 by a pair of bank enable inputs 112, including an OUTA bank enable input 114 and an OUTB bank enable input 116. The memory banks (memory bank 1, ..., and memory bank (N-1)) 108 and 110 may be coupled to the bank select decoder 104 by pairs of bank enable inputs 118 and 120. In general, the memory device 100 may include other memory banks, as indicated by the dashed line 122. Each memory bank 106, 108, and 110 is coupled to first logic device 124 and a second logic device 126 by corresponding output buses. For example, the memory bank 106 is coupled to the first logic device 124 by a first output bus (OUTA) 128 and to the second logic device 126 by a second output bus (OUTB) 130. The memory bank 108 is coupled to the first logic device 124 by a first output bus 132 and to the second logic device 126 by a second output bus 134. The memory bank 110 is coupled to the first logic device 124 by a first output bus 136 and to the second logic device 126 by a second output bus 138. The first logic device 124 includes inputs to receive each of the output buses 128, 132, and 136, and includes an output 140. The output 140 may be utilized to drive a first thread bus output of the memory device 100. The second logic device 126 includes inputs to receive each of the output buses 130, 134, and 138, and includes an output 142, which may be used to drive a second thread bus output of the memory device 100. In a particular embodiment, the first and second logic devices 124 and 126 may be AND logic gates. In this instance, one of the output buses 128, 132, and 136 is active at a time, and the other output buses are held at a logic high voltage level. Thus, the active output of the memory banks 106, 108, and 110 may be provided to first thread bus output 140 via a logical AND operation.

In a particular illustrative embodiment, each logic device 124 and 126 may include a NAND logic gate and an inverter. In another particular illustrative embodiment, each logic device 124 and 126 may include an OR logic gate, and the inactive output buses may be held at a logic low voltage level, allowing the OR logic gate to provide data from one of the output buses 128, 130, 132, 134, 136 and 138 to one of the outputs 140 and 142.

In a particular embodiment, when the output bus 130 is active, the output buses 134 and 138 may be inactive and held at a logic high voltage level. The logic device 126 may perform a logical AND operation on the inputs from the output buses 130, 132, and 138, providing data from the active output bus 130 to the second thread bus output 142. A multiplexer is not needed to select between the outputs 130, 134 and 138 because the non-enabled bank outputs 134 and 138 may be maintained at a fixed voltage level, such as a logic high voltage level. Thus, a logic device 126, such as an AND logic gate, may be used to select between the bus outputs, reducing complexity and improving overall read-timing of the memory device, as compared to a memory device with an output multiplexer.

Figure 2:
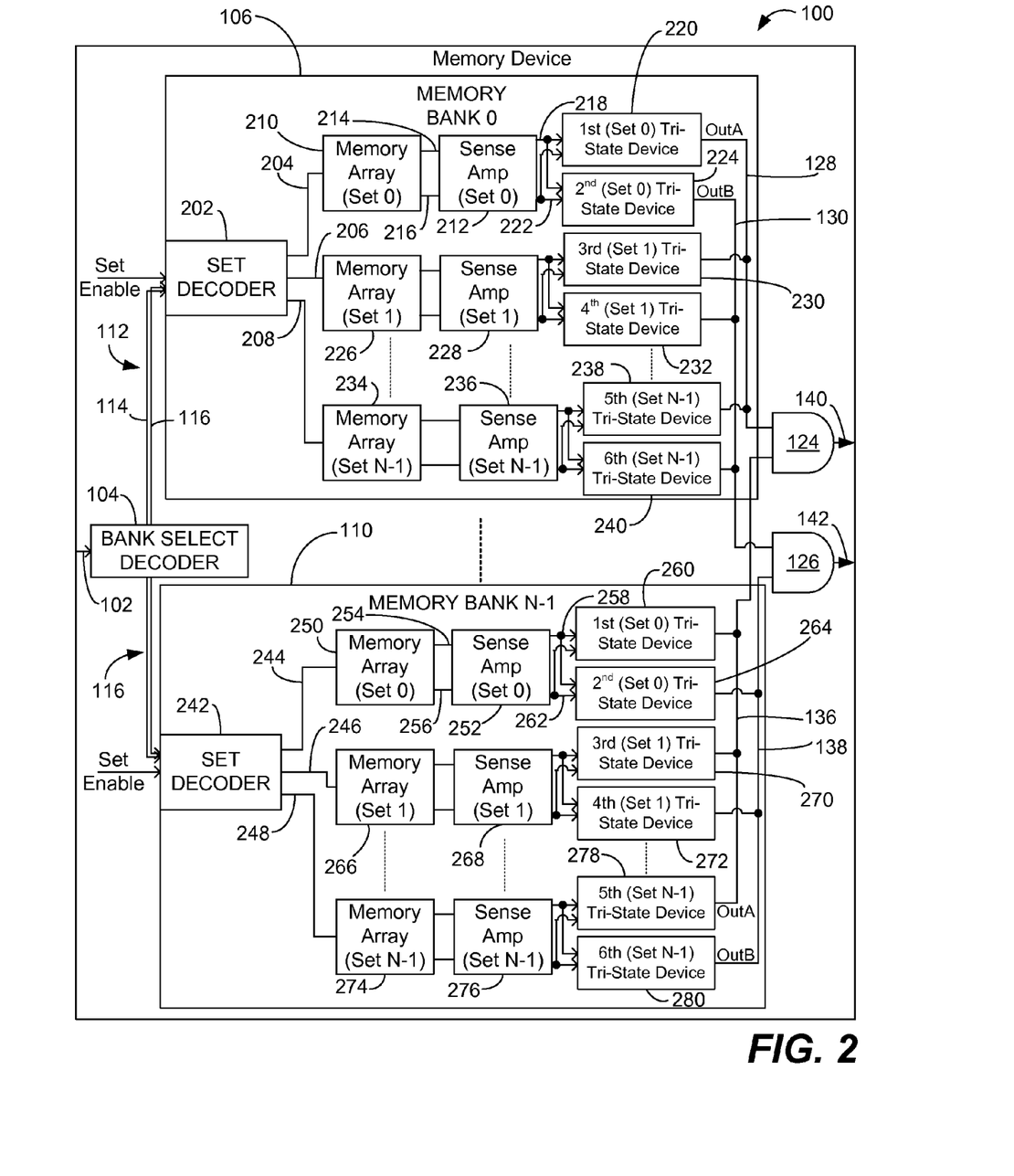
FIG. 2 is a block diagram of a particular illustrative embodiment of a memory device, such as the memory device of FIG. 1.

FIG. 2 is a block diagram that illustrates further details of a particular illustrative embodiment of a memory device, such as the memory device 100 of FIG. 1. The memory device includes the bank select input 102, the bank select decoder 104, and memory banks 106 and 110. The memory banks 106 and 110 are coupled to the bank select decoder 104 via pairs of bank enable inputs 112 and 116, respectively. The pair of bank enable inputs 112 includes an output A bank enable input 114 and an output B bank enable input 116 to select between outputs 128 and 130 of the memory bank 106. The memory device 100 includes a first logic device 124 and a second logic device 126 coupled to the memory buses 128, 130, 136 and 138. The logic device 124 is coupled to the output 140, and the logic device 126 is coupled to the output 142. The memory bank (0) 106 includes multiple memory arrays, such as a memory array (set 0) 210, a memory array (set 1) 226, and a memory array (set N-1) 234. The memory array (set 0) 210 is coupled to a set decoder 202 by a set enable input 204 and is coupled to a sense amplifier 212 by bit lines 214 and 216. The set decoder 202 may be responsive to a set selection input (set enable), to the pair of bank enable inputs 112, or to any combination thereof. The sense amplifier 212 includes sense amplifier outputs 218 and 222, which are coupled to the first tri-state device 220 and to the second tri-state device 224, respectively. The first tri-state device 220 is coupled to the output bus (OUTA) 128, and the second tri-state device 224 is coupled to the output bus (OUTB) 130.

The memory array (set 1) 226 is coupled to the set decoder 202 by a set enable input 206 and is coupled to a sense amplifier 228 by a pair of bit lines. The sense amplifier 228 is coupled to a third tri-state device 230 and a fourth tri-state device 232, which are coupled to the output buses 128 and 130, respectively. The memory array (set N-1) 234 is coupled to the set decoder 202 by a set enable input 208 and is coupled to the sense amplifier 236 by a pair of bit lines. The sense amplifier 236 is coupled to a fifth tri-state device 238 and a sixth tri-state device 240, which are coupled to the output buses 128 and 130, respectively.

The memory bank (N-1) 110 includes multiple memory arrays, such as the memory array (set 0) 250, the memory array (set 1) 266, and the memory array (set N-1) 274. A set decoder 242 may be responsive to a set selection input (set enable), to the pair of bank enable inputs 116, or to any combination thereof, to produce set enable inputs 244, 246, and 248. The memory array (set N-1) 250 is coupled to the set decoder 242 by the set enable input 244 and is coupled to a sense amplifier 252 by bit lines 254 and 256. The sense amplifier 252 includes sense amplifier outputs 258 and 262, which are coupled to a first tri-state device 260 and to a second tri-state device 264. The first tri-state device 260 is coupled to a first output bus (OUTA) 136, and the second tri-state device 264 is coupled to a second output bus (OUTB) 138. The memory array (set 1) 266 is coupled to the set decoder 242 by the set enable input 246 and is coupled to the sense amplifier 268 by a pair of bit lines. The sense amplifier 268 is coupled to a third tri-state device 270 and a fourth tri-state device 272, which are coupled to the output buses 136 and 138, respectively. The memory array (set N-1) 274 is coupled to the set decoder 242 by the set enable input 248 and is coupled to the sense amplifier 276 by a pair of bit lines. The sense amplifier 276 is coupled to a fifth tri-state device 278 and a sixth tri-state device 280, which are coupled to the output buses 136 and 138, respectively. The output buses 128 and 136 are coupled to the output 140 via the logic device 124, and the output buses 130 and 138 are coupled to the output 142 via the logic device 126.

In a particular illustrative embodiment, a bank selection may be received at the bank select input 102. The bank select decoder 104 may decode the bank selection and selectively enable either one of the pair of bank enable inputs 112 or one of the pair of bank enable inputs 116 according to the decoded bank selection. In a particular illustrative embodiment, the bank enable input 114 may be enabled. The memory bank (0) 106 is activated by the bank enable input 114. The set decoder 202 may decode information received via a set enable input (set enable), the bank enable input 114, or any combination thereof, to determine which of the memory arrays 210, 226, and 234 to activate. The set decoder 202 may selectively enable one of the set enable inputs 204, 206, or 208. In a particular embodiment, the memory array (set 0) 210 is activated in response to the set enable input 204 to apply a voltage to the bit lines 214 and 216. The sense amplifier 212 determines a differential voltage from the bit lines 214 and 216 and provides a first sense amplifier output 218 and a second sense amplifier output 222 to the first tri-state device 220 and the second tri-state device 224. In general, either the first output bus 128 or the second output bus 130 may be activated to provide data to the corresponding output 140 or 142. In a particular embodiment, if the output bus (OUTB) 130 is active, the output bus (OUTB) 138 may be maintained at a logic high voltage level, which makes the output 142 of the logic device 126 reflect the output bus (OUTB) 130 without complex multiplexing.

Figure 3:
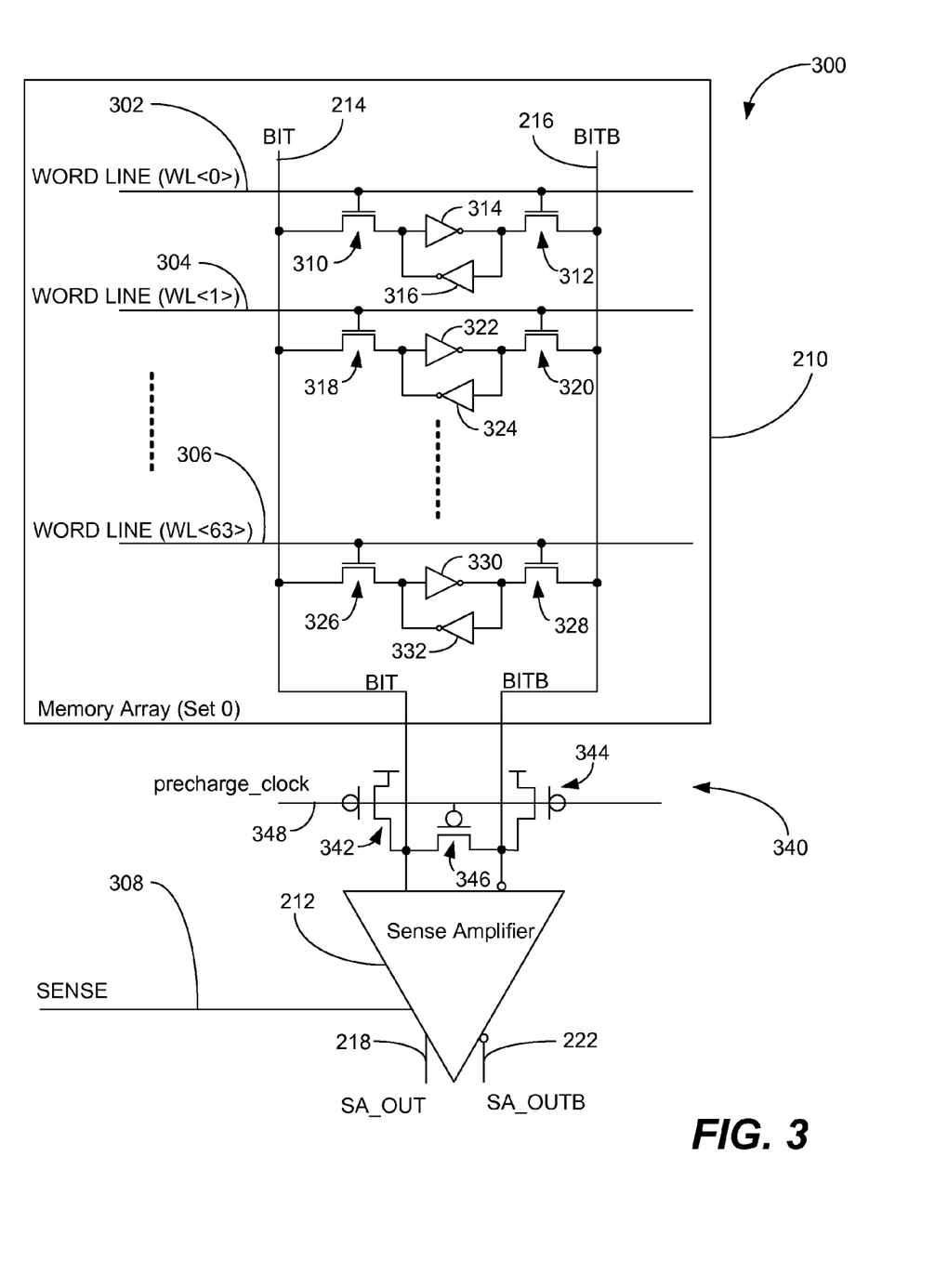
FIG. 3 is a circuit diagram of a particular illustrative embodiment of a portion of a memory device, such as the memory device of FIG. 2, including a sense amplifier and a precharge device.
Figure 4:
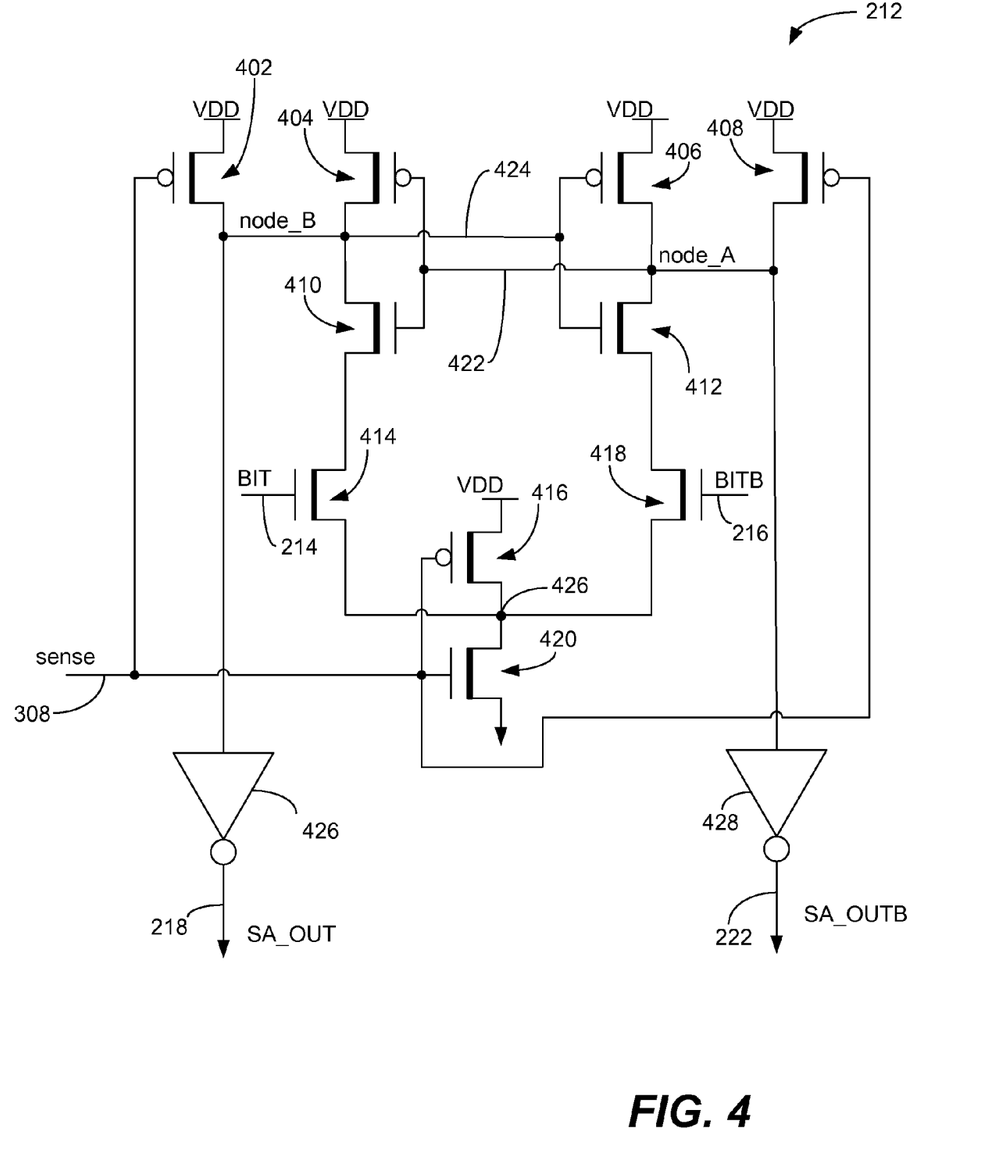
FIG. 4 is a circuit diagram of a particular illustrative embodiment of a representative sense amplifier, such as the sense amplifier of FIG. 3.

FIG. 3 is a circuit diagram of a particular illustrative embodiment of a portion 300 of a memory device, such as the memory device 100 shown in FIG. 1, including a part of the memory array 210 and an associated sense amplifier, such as the representative sense amplifier 212 shown in FIG. 4. The memory array 210 includes representative illustrative wordlines (WL<0>, WL<1>, ..., WL<63>) 302, 304 and 306, a first bit line 214, a second bit line (BITB) 216, the sense amplifier 212, a sense amplifier control input 308, a first sense amplifier output 218 and a second sense amplifier output (SA_OUTB) 222. The representative illustrated wordline (WL<0>) 302 includes associated circuit structures, including a first transistor 310, a second transistor 312, and a cross-coupled inverter including inverters 314 and 316. The representative illustrated wordline (WL<1>) 304 includes associated circuit structures, including a first transistor 318, a second transistor 320, and a cross-coupled inverter including inverters 322 and 324. The representative illustrated wordline (WL<63>) 306 includes associated circuit structures, including a first transistor 326, a second transistor 328, and a cross-coupled inverter including inverters 330 and 332. In general, data may be stored in the circuit structures associated with each wordline. The particular memory array of the portion 300 of the memory device is depicted as having 64 representative wordlines (WL<0>, WL<1>, ..., WL<63>). However, a particular memory array may include any number of wordlines.

The portion 300 of the memory device may also include a precharge device 340, including transistors 342, 344, and 346, and a precharge clock input 348. The transistor 342 includes a first terminal coupled to a voltage supply terminal (such as VDD), a control terminal coupled to the precharge clock input 348, and a second terminal coupled to the bit line 214. The transistor 344 includes a first terminal coupled to a voltage supply terminal (such as VDD), a control terminal coupled to the precharge clock input 348, and a second terminal coupled to the bit line 216. The transistor 346 includes a first terminal coupled to the bit line 214, a control terminal coupled to the precharge clock input 348, and a second terminal coupled to the bit line 216.

In a particular illustrative embodiment, the bit lines 214 and 216 are precharged to a voltage level (VDD) when they are inactive. When a particular wordline, such as the wordline (WL<0>) 302, is active, either bit line 214 or bit line 216 may have a voltage drop because of the discharge path from the respective bit line through the first and second transistors 310 and 312. Data is read from the associated circuit structures onto the bit lines 214 and 216. When the sense amplifier control input 308 is low, the first and second sense amplifier outputs 218 and 222 are low. When the sense amplifier control input 308 is high, either the first sense amplifier output 218 or the second sense amplifier output (SA_OUTB) 222 may rise to the voltage level (VDD) based on a voltage difference between bit line 214 (BIT) and bit line 216 (BITB).

FIG. 4 is a circuit diagram of a particular illustrative embodiment of a representative sense amplifier, such as the sense amplifier 212 in FIGS. 2 and 3. The sense amplifier 212 includes bit line inputs 214 and 216, first and second sense amplifier outputs 218 and 222, and a sense amplifier control input 308. The sense amplifier 212 also includes transistors 402, 404, 406, 408, 410, 412, 414, 416, 418, and 420, a line (node_A) 422, a line (node_B) 424, and inverters 426 and 428. The lines (node_A and node_B) 422 and 424 are internal nodes of the representative sense amplifier. The transistor 402 includes a first terminal coupled to a voltage supply terminal (such as VDD), a control terminal coupled to the sense amplifier control input 308, and a second terminal coupled to the inverter 426. The transistor 408 includes a first terminal coupled to a voltage supply terminal (such as VDD), a control terminal coupled to the sense amplifier input 308, and a second terminal coupled to the inverter 428. The transistor 404 includes a first terminal coupled to a voltage supply terminal (such as VDD), a control terminal coupled to the line (node_A) 422, and a second terminal coupled to the line (node_B) 424. The transistor 410 includes a first terminal coupled to the line (node_B) 424, a control terminal coupled to line (node_A) 422, and a second terminal. The transistor 414 includes a first terminal coupled to the second terminal of the transistor 410, a control terminal coupled to the bit line input 214, and a second terminal coupled to a node 426. The transistor 416 includes a first terminal coupled to a voltage supply terminal (such as VDD), a control terminal coupled to the sense amplifier control input 308, and a second terminal coupled to the node 426. The transistor 420 includes a first terminal coupled to the node 426, a control terminal coupled to the sense amplifier control input 308, and a second terminal coupled to a voltage supply terminal (such as an electrical ground). The transistor 406 includes a first terminal coupled to a voltage supply terminal (such as VDD), a control terminal coupled to the line (node_B) 424, and a second terminal coupled to the line (node_A) 422. The transistor 412 includes a first terminal coupled to the line (node_A) 422, a control terminal coupled to the line (node_B) 424, and a second terminal. The transistor 418 includes a first terminal coupled to the second terminal of the transistor 412, a control terminal coupled to the bit line input (BITB) 216, and a second terminal coupled to the node 426.

In a particular embodiment, when the sense amplifier control input 308 is at a logic low level (e.g., zero volts), the transistors 402 and 408 are activated to apply a voltage level (such as VDD) to the inverters 426 and 428, resulting in a logic low level at the outputs 218 and 222. Additionally, the low logic level of the sense amplifier control input 308 deactivates the transistor 420 and activates the transistor 416 to apply a voltage level (such as VDD) to the node 426.

In a particular illustrative embodiment, when the sense amplifier control input 308 is at a high voltage level, the transistors 402, 408 and 416 are deactivated. A voltage difference between bit line (BIT) 214 and bit line (BITB) 216 may force one of the line (node_A) 422 or the line (node_B) 424 to a logic low level and the other line to a logic high voltage level (such as VDD) and may force one of the corresponding inverters' outputs, such as sense amplifier outputs (SA_OUT) 218 and (SA_OUTB) 222, to be at a logic high level and the other to be at a logic low level.

Figure 5:
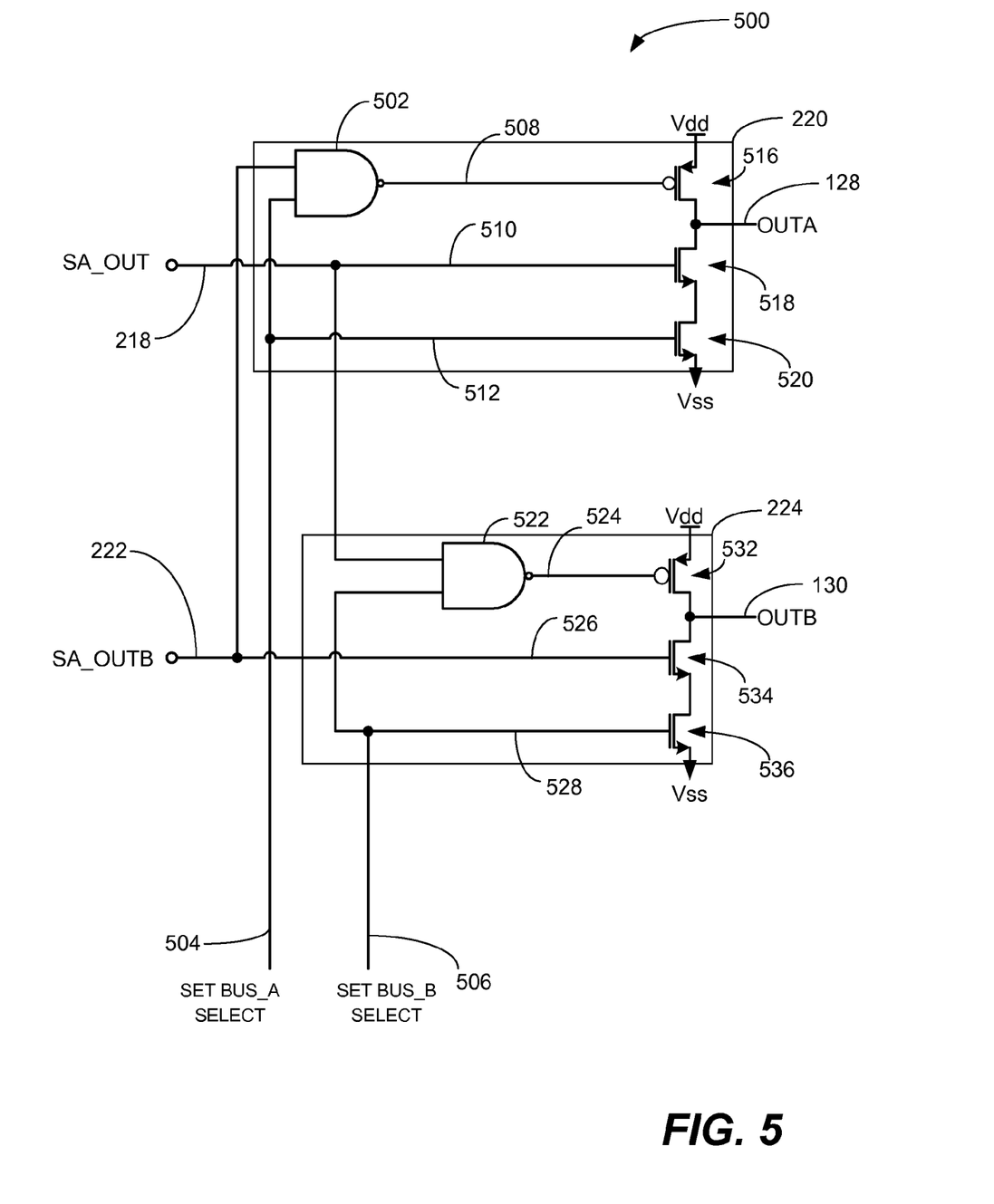
FIG. 5 is a diagram of a particular illustrative embodiment of a circuit device to drive dual output buses of a memory array using the outputs of the sense amplifier of FIG. 3.

FIG. 5 is a diagram of a particular illustrative embodiment of a circuit device 500 to drive a dual bus memory array using the outputs of a sense amplifier, such as the outputs 218 and 222 of the sense amplifier 212 in FIG. 3. The circuit device 500 includes the sense amplifier first output (SA_OUT) 218, the sense amplifier second output (SA_OUTB) 222, a first tri-state device 220, and a second tri-state device 224. The circuit device 500 also includes a first bus select input (BUS_A SELECT) 504 and a second bus select input (BUS_B SELECT) 506. The first tri-state device 220 includes a first NAND gate 502, data lines 508, 510, and 512, and transistors 516, 518 and 520. The first tri-state device 220 is also coupled to the first output bus (OUTA) 128. The second tri-state device 224 includes a second NAND gate 522, data lines 524, 526, and 528, and transistors 532, 534, and 536. The second tri-state device 224 is also coupled to the second output bus (OUTB) 130.

The sense amplifier first output 218 is coupled to the second NAND gate 522 of the second tri-state device 224 and is coupled to the transistor 518 of the first tri-state device 220. The sense amplifier second output 222 is coupled to the first NAND gate 502 of the first tri-state device 220 and is coupled to the transistor 534 of the second tri-state device 224. The bus select input (BUS_A SELECT) 504 is coupled to the first NAND gate 502 of the first tri-state device 220 and is coupled to the transistor 520 via the data line 512. An output of the first NAND gate 502 is coupled to the transistor 516 via the data line 508. The bus select input (BUS_B SELECT) 506 is coupled to the second NAND gate 522 and is coupled to the transistor 536 via the data line 528. An output of the second NAND gate 522 is coupled to the transistor 532 via the data line 524.

In a particular illustrative embodiment, a sense amplifier, such as the sense amplifier 212 in FIG. 3, applies a first output signal to the sense amplifier first output 218 and a second output signal to the sense amplifier second output 222. In general, the first bus select input 504 and the second bus select input 506 may be active at the same time, allowing the sense amplifier 212 to drive one or both output buses 128 and 130 of a memory bank, such as the memory bank 106 shown in FIG. 1

In a particular embodiment, the transistors 516 and 532 may be p-channel transistors, and the transistors 518, 520, 534, and 536 may be n-channel transistors. In general, the bus select inputs 504 and 506 select the output bus 128 or the output bus 130, respectively.

In a particular illustrative embodiment, if the bus select input (BUS_A SELECT) 504 is at a logic low level and the bus select input (BUS_B SELECT) 506 is at a logic high level, the first NAND gate 502 applies a fixed logic high output to the data line 508, which is inverted at the control terminal of the transistor 516. The bus select input (BUS_A SELECT) 504 turns off the transistor 520, keeping the first tri-state device 220 inactive. The output bus (OUTA) 128 may be either held at a fixed voltage level by a transistor device, such as a transistor similar to the transistor 710 of FIG. 7, for example, or may be driven by other enabled set's (such as memory arrays 704 and 706 shown in FIG. 7) tri-state devices, such as the tri-state device 220. The logic high level of the bus select input (BUS_B SELECT) 506 activates the second tri-state device 224 to provide the data from the sense amplifier's first and second outputs 218 and 222 to the output bus (OUTB) 130. The bus select input (BUS_B SELECT) 506 activates the transistor 536 and provides a logic high input to the second NAND gate 522, allowing data from the sense amplifier's first output 218 to appear on the data line 524 and the data from the sense amplifier's second output 222 to appear on line 526 and on the output bus (OUTB) 130. In a particular embodiment, when the sense amplifier control input, such as the sense amplifier control input 308 in FIGS. 3 and 4, is active, the sense amplifier outputs 218 and 222 behave as if they were mutually exclusive. In general, either the sense amplifier output 218 or the sense amplifier output 222 may rise to a voltage level (such as the voltage level VDD) when a sense amplifier control input 308 is provided to the sense amplifier 212.

In a particular embodiment, when a memory bank is enabled, the bus select inputs, such as the bus select inputs 504 and 506, may be held at a logic low level until a particular bus is selected. By holding the bus select inputs 504 and 506 at a logic low voltage level, the transistors 516, 520, 532, and 536 are inactive.

In general, the particular illustrative embodiment of the circuit device 500 of FIG. 5 allows the sense amplifier 212 to selectively drive dual output buses of a memory bank, such as the output buses 128 and 130 shown in FIG. 1. By selectively activating the first tri-state device 220 or the second tri-state device 224 via the first and second bus select inputs 504 and 506, the dual outputs 218 and 222 of a sense amplifier may be utilized to drive dual buses of a memory bank, such as the memory bank 106 shown in FIG. 1, which allows the sense amplifier 212 to support a two-thread memory access.

Figure 6:
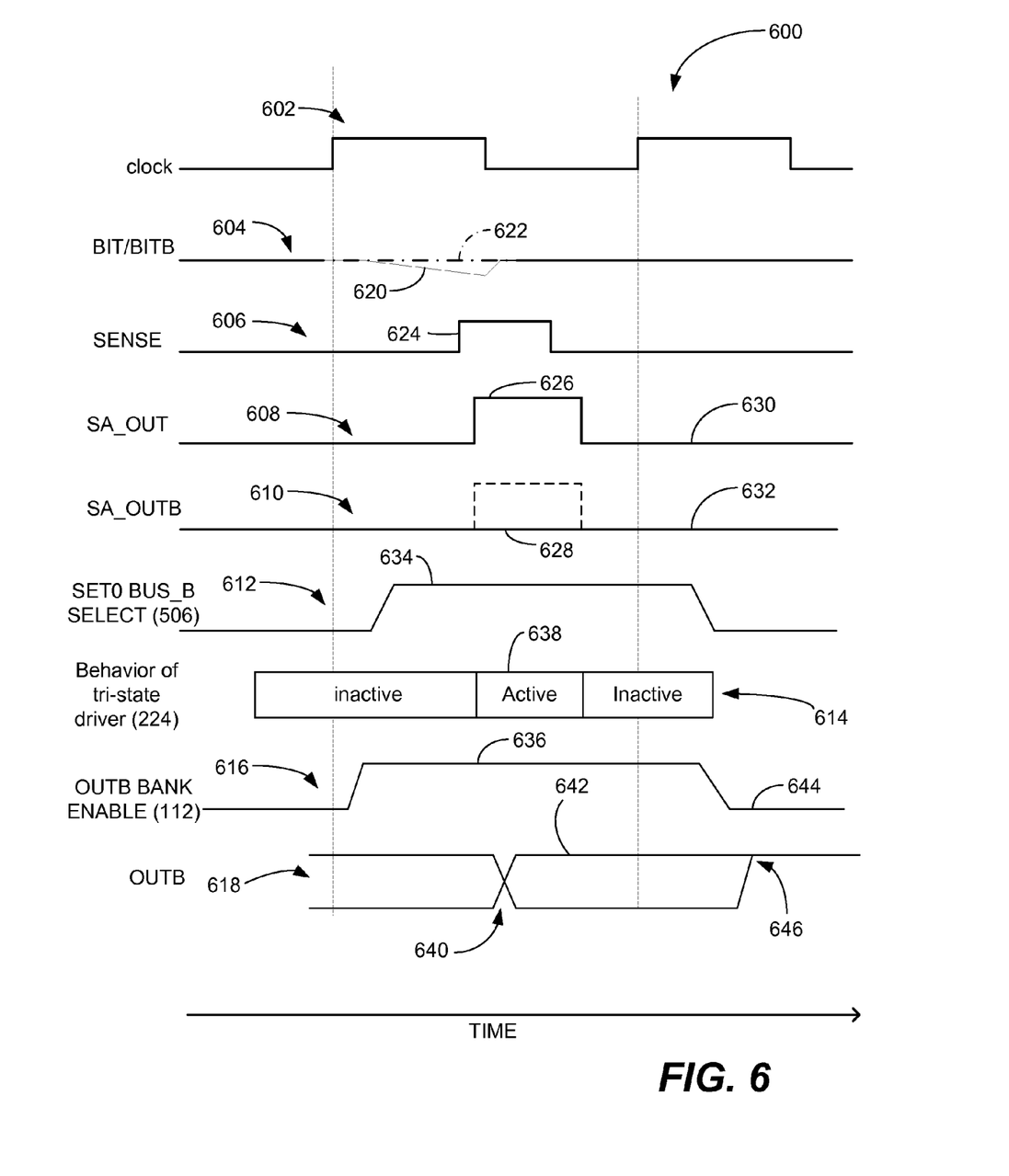
FIG. 6 is a timing diagram of a particular illustrative embodiment of a sense amplifier, such as the sense amplifier of FIG. 3.

FIG. 6 is a timing diagram 600 of a particular illustrative embodiment of a sense amplifier, such as the sense amplifier 212 of FIG. 3. The diagram 600 includes a clock signal 602 which memory banks are based on, a pair of bit signals 604 (such as from the bit lines 214 and 216 in FIG. 2), a sense amplifier enable (control) signal 606 (such as 308 in FIG. 4), an SA_OUT signal 608 (such as 218 in FIG. 4), an SA_OUTB signal 610 (such as 222 in FIG. 4), a BUS_B SELECT input 612 (such as 506 in FIG. 5), a tri-state device behavior indicator 614, an OUTB bank enable signal 616 (such as 112 in FIG. 1), and an OUTB signal 618 (such as 130 in FIG. 5). In general, when a clock signal activates a wordline driver to drive a selected wordline, such as the wordline 302 in FIG. 3, the transistors 310 and 312 in FIG. 3 are activated, and a voltage drop may be applied to one of the bit lines 214 and 216.

The bit signal 604 refers to a voltage level of the bit lines 214 and 216 in FIG. 3. As shown, when the clock 602 associated with a particular wordline, such as the wordline (WL<0>) 302 in FIG. 3, is at a logic high level, the voltage levels on the bit lines 214 or 216 may change over a period of time, resulting in a differential voltage between the bit lines 214 and 216, as indicated at 620 and 622. A sense amplifier, such as the sense amplifier 212 in FIG. 3, may be activated by a sense amplifier enable (control) signal 308 at 606. When the sense enable input rises at 624, one of the sense amplifier output signal 608 (e.g., a signal on sense amplifier output 218 in FIG. 3) or the sense amplifier output signal 610 (e.g., a signal on sense amplifier output 222 in FIG. 3) may rise as indicated at 626 and 628, respectively. When the sense enable input falls, the output signals 608 and 610 fall to a logic low level, as indicated at 630 and 632, respectively. In general, a tri-state device (such as the tri-state device 224 in FIGS. 2 and 3, is activated by the second bus select input signal 612, the sense enable input signal 606, and the OUTB bank enable signal 616. When the BUS_B SELECT input signal 612 is high at 634, the sense amplifier control input signal 606 is high at 624, and the OUTB bank enable signal 616 is high at 636, the tri-state driver becomes active at 638. The tri-state device causes the output (OUTB) signal to change at 640 because of a push-pull effect of the tri-state device. The output bus (OUTB) value is held at 642 by a pair of cross-coupled inverters (such as cross-coupled inverters 714 and 716 in FIG. 7). Once the OUTB bank enable signal 616 falls to a logic low level at 644, a pull-up transistor (such as the transistor 710 in FIG. 7) may pull the output bus (OUTB) signal 618 to a logic high level at 646 (such as a voltage level VDD).

Figure 7:
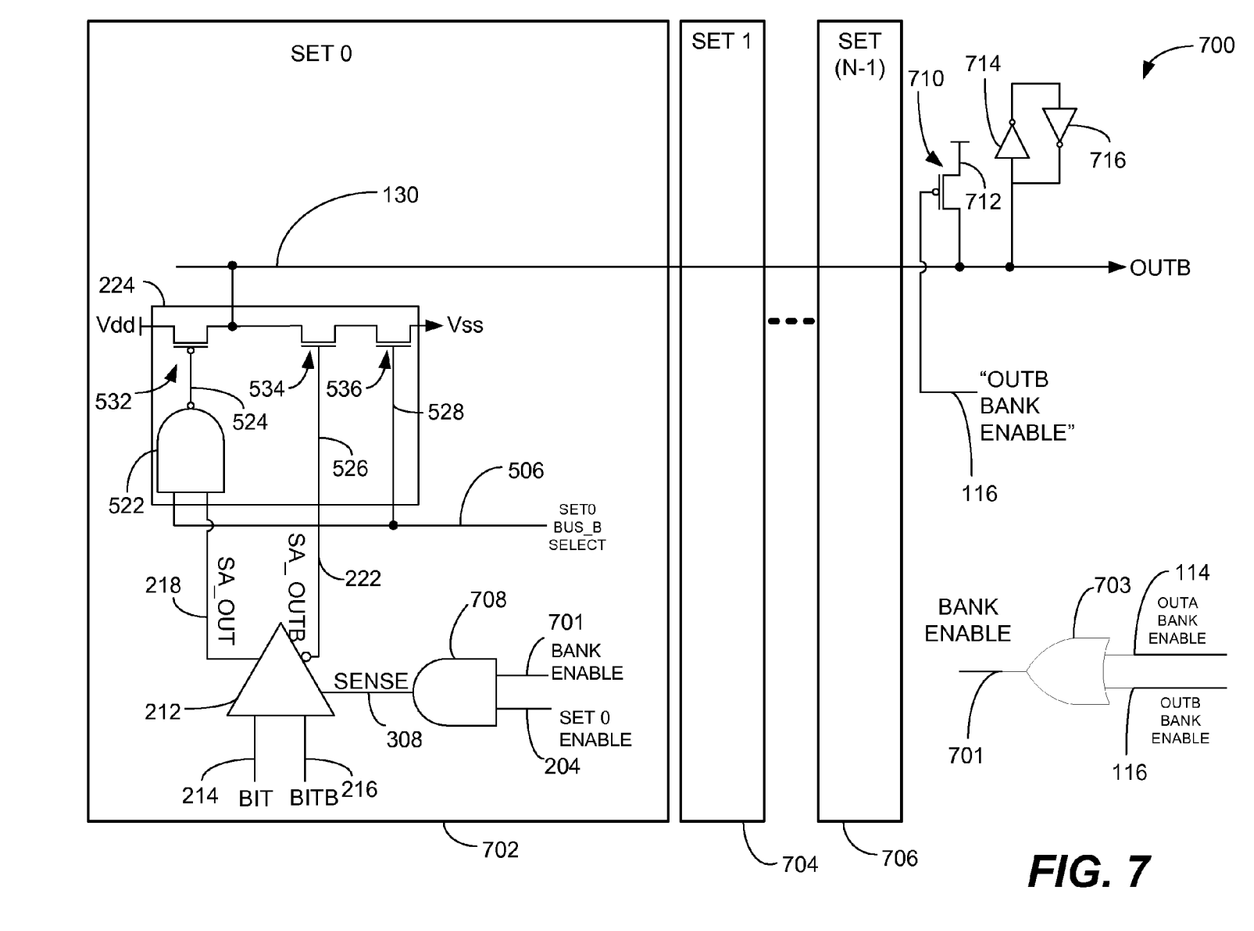
FIG. 7 is a block diagram of a particular illustrative embodiment of a memory bank including a memory array having a tri-state bus driven by an output of a sense amplifier, such as the sense amplifier of FIG. 3.

FIG. 7 is a block diagram of a particular illustrative embodiment of a memory bank 700, including multiple memory arrays (sets 0, set 1, . . . , set N-1). The memory bank 700 includes memory arrays 702, 704 and 706. The memory array 702 includes a sense amplifier 212 to receive input bit lines 214 and 216 and to receive a sense enable (control) input 308. The sense amplifier 212 provides the first output (SA_OUT) 218 and the second output (SA_OUTB) 222 to the second tri-state device 224. The second tri-state device 224 includes the NAND gate 522, the bus select input (SET0 BUS_B SELECT) 506, data lines 524, 526, and 528, and transistors 532, 534, and 536. The memory bank 700 also includes an AND gate 708, a bank enable input 112 and a set (array) enable input 204, the output bus (OUTB) 130, a transistor 710, and cross-coupled inverters 714 and 716. The bank enable input 701 may be generated using a logical OR gate 703, for example, to perform a logical OR operation on the OUTA bank enable input 114 and the OUTB bank enable input 116.

The transistor 710 includes a first terminal 712 coupled to a voltage supply terminal (such as VDD), a control terminal coupled to the OUTB bank enable input 116, and a second terminal coupled to the output bus (OUTB) 130. The first output (SA_OUT) 218 of the sense amplifier 212 provides a first input to the NAND gate 522. The second bus select input (SET0 BUS_B SELECT) 506 provides a second input to the NAND gate 522. The second output (SA_OUTB) 222 of the sense amplifier 212 is coupled to a control terminal of the transistor 534 via the data line 526. The bus select input (SET0 BUS_B SELECT) 506 is coupled to a control terminal of the transistor 536 via the data line 528. In general, the first tri-state device 220, the bus select input (SET0 BUS_A SELECT) 504, and the corresponding output bus (OUTA) 128 are omitted from FIG. 7 for clarity. Additionally, it should be understood that the memory arrays 704 and 706 include similar structures, which are omitted for clarity, that may be coupled to the output buses (OUTA and OUTB) 128 and 130

In a particular embodiment, when the memory bank 700 is not selected for driving data bus OUTB 130 (e.g., the bank enable input 116 is at a logic low level), the transistor 710 pulls the output bus (OUTB) 130 to a logic high level. In general, when a sense enable (sense amplifier control input 308) is asserted, only one of the sense amplifier output (SA_OUT) 218 or the sense amplifier output (SA_OUTB) 222 may rise. When the sense enable control input 308 is de-asserted (inactive), the sense amplifier outputs 218 and 222 fall to a logic low level. In general, when a bank enable 116 is at a logic low level, the BUS_B SELECT 506 is at a logic low level. It should be understood that the memory array 702 may include multiple tri-state devices, such as the tri-state devices 220 and 224 in FIGS. 2 and 5. The transistor 710 pulls up the voltage level of the output bus 130 to VDD. In general, all sets (702, 704, and 706) that are inside the particular bank behave the same when the OUTB bank-enable 116 is at a logic low level. Thus, there is no conflict between the tri-state devices, such as the tri-state device 224, and the transistor 710 over the output bus 130. The second bus select 506 is at logic low forcing the tri-state device 224 to be inactive, allowing the transistor 710 to control the voltage level of the output bus 130.

In a particular embodiment, the logic high level may be a default voltage level for each output bus of the memory bank 700. When the memory bank 700 and its associated memory array (set 0) are selected for driving data bus OUTB 130 (e.g., the OUTB bank enable input 116 is at a logic high level), the transistor 710 is deactivated and the bank enable input 701 is at a logic high level. The AND gate 708 may perform a logical AND operation on the bank enable input 701 and the set-enable input 204 to determine the sense enable input 308 to the sense amplifier 212. When the sense enable input 308 activates the sense amplifier 212, the sense amplifier 212 provides the first output (SA_OUT) 218 and the second output (SA_OUTB) 222, which may be selectively driven onto the output bus (OUTB) 130 according to the bus select input 506. One of the first output (SA_OUT) 218 and the second output (SA_OUTB) 222 is at a logic high voltage level, and the other output is at a logic low voltage level.

In general, the sense amplifier 212 may be used, for example, in a two-threaded 64-bit memory access with a dual read. A memory device, such as a cache memory, may address a single memory bank, such as the memory bank 700, to reduce access conflicts.

In a particular illustrative, non-limiting embodiment, the bank enable input 701, the set enable input 204, and the second bus select input (SET0 BUS_B SELECT) 506 may be determined, for example, from decoded portions of a control signal from a logic device or controller (not shown). In a particular illustrative embodiment, when the OUTB bank enable 116 is deactivated, the bus select input (SET0 BUS_B SELECT) 506 is at a logic low level, which keeps the tri-state device (driver) 224 inactive. Similarly, when the OUTA bank enable 114 is deactivated, the corresponding bus select input (SET0 BUS_A SELECT) (not shown) is at a logic low level, which keeps the associated tri-state device (driver) 220 (shown in FIG. 2) inactive. In general, the sense amplifier 212 is activated when one of the output bus (OUTA or OUTB) 128 and 130 is needed, and otherwise the sense amplifier 212 is deactivated.

Figure 8:
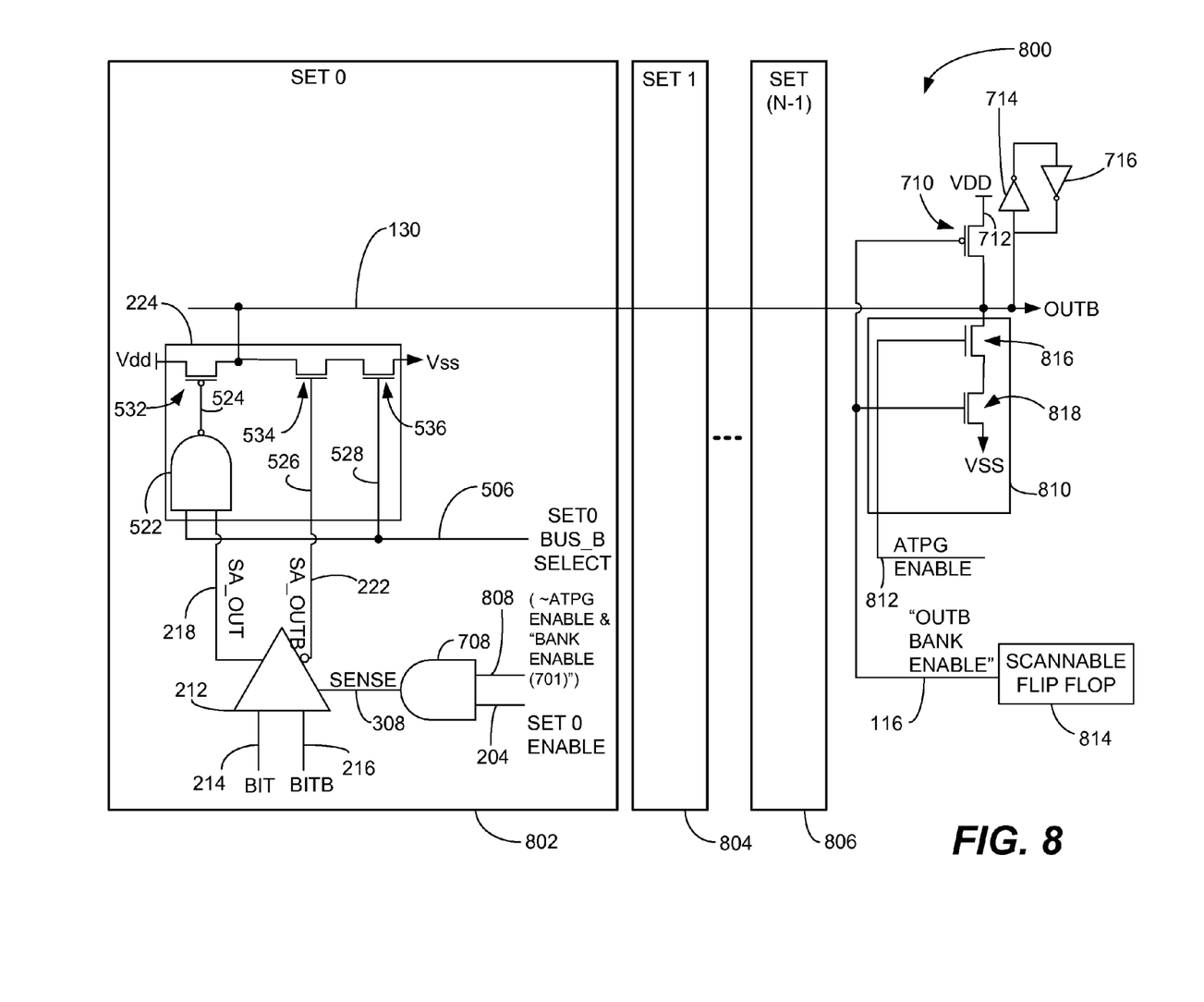
FIG. 8 is a block diagram of another particular illustrative embodiment of a memory bank including a tri-state bus driven by an output of a sense amplifier, such as the sense amplifier of FIG. 3, and including an automatic test program generation (ATPG) input structure.

FIG. 8 is a block diagram of another particular illustrative embodiment of a memory bank 800, including multiple memory arrays (sets 0, set 1, . . . , set N-1) 802, 804 and 806. The memory bank 800 may include an automatic test pattern generation (ATPG) and bank enable input 808, a test structure 810, an ATPG input 812, and a scannable flip flop device 814. In a particular embodiment, the ATPG and bank enable input 808 may be generated from the inverted ATPG enable 812 and from the bank enable input 701, shown in FIG. 7. In general, the test structure 810 is coupled to the output bus (OUTB) 130. The test structure 810 includes a first transistor 816 and a second transistor 818. The first transistor 816 includes a first terminal coupled to the output bus (OUTB) 130, a first control terminal coupled to the ATPG enable input 812, and a second terminal. The second transistor 818 includes a third terminal coupled to the second terminal, a second control terminal coupled to the bank enable input (OUTB bank enable) 116, and a fourth terminal coupled to a voltage supply terminal (VSS).

In general, the inverted ATPG enable and bank enable input 808 may be provided to the AND gate 708. However, the memory array (set 0) 802's sense amplifier 212 is only activated when the both input 808 and set enable input 204 are enabled. Thus, the tri-state device 224 remains inactive during testing, allowing the output bus (OUTB) 130 to be tested without interference from the tri-state device 224. In general, the other tri-state devices of the sets within the bank may also remain inactive during testing (e.g., all of the sense amplifier control inputs are inactive, holding the sense amplifier outputs (such as SA_OUT 218 and SA_OUTB 222) of the sense amplifiers (such as the sense amplifier 212) are at a logic low level, which forces the associated tri-state devices (such as the tri-state device 224) to be inactive.

In general, during normal operation, the memory bank 800 may operate as described above with respect to FIG. 6. The test structure 810 is inactive because the ATPG enable input 812 is held at a logic low level, deactivating the transistor 816, which presents a high impedance to the output bus (OUTB) 130. During a test mode of operation, the ATPG enable input 812 may be at a logic high voltage level, activating the transistor 816. The OUTB bank enable input 116 may be activated, deactivating the transistor 710. Data may be applied to the OUTB BANK ENABLE 116 by the scannable flip flop 814 to provide test data to the output bus (OUTB) 130 without activating the memory sets (set 0, set 1, . . . , set (N-1)) 802, 804, and 806. In general, the test structure 810 allows the memory output bus (OUTB) 130 of the memory bank 802 to be tested without having to activate the memory bank sets, such as 802, 804 and 806. Additionally, the test structure 810 allows a designer to place automatic test pattern generation data on the output bus (OUTB) 130. The test structure 810 allows for test insertion without introducing delays in normal operation. For example, during normal operation, the ATPG enable input 812 is held at a logic low level, deactivating the transistor 816, which presents a high impedance to the output bus (OUTB) 130. In a test mode of operation, the transistor 816 is activated to place ATPG data from signal OUTB BANK ENABLE 116 onto the output bus (OUTB) 130 via the transistor 818 from scannable Flip-Flop 814.

In general, by providing a transistor 710 to pull up the voltage level of the output bus (OUTB) 130 when the memory bank's output bus 130 is not active, the active memory bank's output bus may be selected by performing a logical AND operation on all of the outputs. Since all of the output buses are held at a logic high voltage level except for the active output bus, an AND gate may be used to select among the output buses of memory banks, such as 128, 132 and 136 in FIG. 1, and the output of the AND gate would reflect the data from the active bank's output bus.

Figure 9:
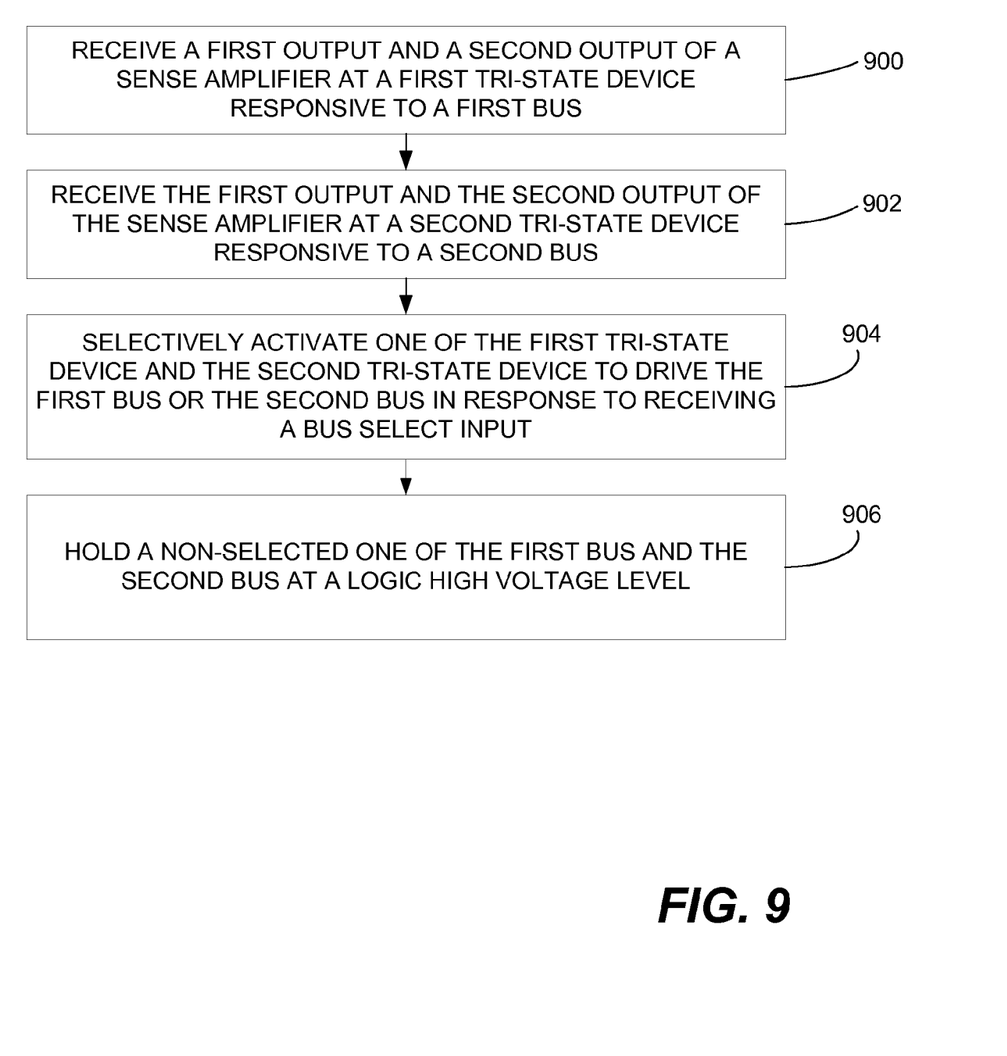
FIG. 9 is a flow diagram of a particular illustrative embodiment of a method for selectively driving one of two output buses of a memory array using a sense amplifier, such as the sense amplifier of FIG. 3.

FIG. 9 is a flow diagram of a particular illustrative embodiment of a method for selectively driving one of two output buses of a memory array using a sense amplifier, such as the sense amplifier of FIG. 3. A first output and a second output of a sense amplifier are received at a first tri-state device coupled to a first bus, at 900. The first output and the second output of the sense amplifier are received at a second tri-state device coupled to a second bus, at 902. Either the first tri-state device or the second tri-state device is selectively activated to drive the first bus or the second bus in response to receiving a bus select input, at 904. A non-selected one of the first bus and the second bus is held at a logic high voltage level, at 906.

In a particular embodiment, a transistor, such as the transistor 710 in FIGS. 7 and 8, may be utilized to hold the output bus (OUTB) 130 at a logic high level, unless the output bus (OUTB) 130 is active. By holding the inactive output buses at a logic high level, the voltage levels of the inactive output buses are known and may be utilized in a logical AND operation (rather than via a multiplexer) to select between the outputs. Thus, timing delays may be reduced. In a particular embodiment, the first tri-state device 220 and the second tri-state device 224 may be activated by a set enable input 204 and by an associated bus select input, such as the first bus select input 504 and the second bus select input 506.

In a particular embodiment, the method may also include receiving a bank enable signal, receiving a memory array enable signal, and deriving a sense enable input from the bank enable signal and the memory array enable signal to selectively activate the sense amplifier. In a particular illustrative embodiment, a sense enable input (such as the sense enable (control) input 308 shown in FIG. 3) may be derived using logic (such as the AND gate 708 in FIG. 7) based on inputs, such as the bank enable input 116 and the set enable input 204 in FIG. 2. In a particular embodiment, the set enable input 204 may select a particular memory array of a memory bank, such as the memory bank 700 shown in FIG. 7. In a particular embodiment, the sense enable input 308 may be derived by performing a logical AND operation on the bank enable signal 701 and the memory array (set) enable signal 204. In another particular embodiment, a first tri-state device and the second tri-state device (such as the tri-state devices 220 and 224) may be activated to perform a dual read operation, reading data from a first wordline (such as wordline 302 shown in FIG. 3) and from a second wordline (such as wordline 304 shown in FIG. 3).

The various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable any person skilled in the art to make or use the present disclosure. Various modifications to such disclosed embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A method comprising:
   receiving a bank enable signal;
   receiving a memory array enable signal;
   deriving a sense input in response to the bank enable signal and the memory array enable signal to selectively activate a sense amplifier;
   receiving a first sense output and a second sense output of the sense amplifier at a first tri-state device coupled to a first bus;
   receiving the first sense output and the second sense output of the sense amplifier at a second tri-state device coupled to a second bus; and selectively activating at least one of the first tri-state device and the second tri-state device to drive at least one of the first bus and the second bus in response to a bus select input.

2. The method of claim 1, further comprising holding a non-selected one of the first bus and the second bus at a logic high voltage level.

3. The method of claim 1, wherein deriving the sense input comprises performing a logical AND operation on the bank enable signal and the memory array enable signal.

4. The method of claim 1, further comprising:
activating the first tri-state device and the second tri-state device to perform a dual read operation.

5. The method of claim 1, further comprising:
activating the first tri-state device and the second tri-state device to perform a read operation at the first bus and a read operation at the second bus.

6. A circuit device comprising:
a first tri-state device coupled to a first bus;
a second tri-state device coupled to a second bus;
a sense amplifier responsive to a first bit line of a memory array and responsive to a second bit line of the memory array, the sense amplifier comprising a first output coupled to the first tri-state device and a second output coupled to the second tri-state device, the sense amplifier to selectively drive one of the first bus and the second bus; and
means for deriving a sense input in response to a bank enable signal and a memory array enable signal to selectively activate the sense amplifier.

7. The circuit device of claim 6, further comprising:
a bus select input coupled to the sense amplifier to select one of the first bus and the second bus.

8. The circuit device of claim 6, wherein the means for deriving the sense input comprises a device to perform a logical AND operation on the bank enable signal and the memory array enable signal.

9. The circuit device of claim 6, further comprising: a first bus select input coupled to the first tri-state device to select the first bus; and a second bus select input coupled to the second tri-state device to select the second bus.

10. The circuit device of claim 6, wherein the sense amplifier determines an output related to voltage levels of the first bit line and the second bit line and selectively drives one of the first bus and the second bus based on the determined output.

11. A circuit device comprising:
means for receiving a first sense output of a sense amplifier at a first tri-state device responsive to a first bus;
means for receiving a second sense output of the sense amplifier at a second tri-state device responsive to a second bus;
means for selectively driving the first bus using one of the first sense output and the second bus using the second sense output in response to a bus selection; and
means for deriving a sense input from a bank enable signal and a memory array enable signal to activate the means for selectively driving.

12. The circuit device of claim 11, further comprising means for holding a non-selected one of the first bus and the second bus at a logic high voltage level.

13. The circuit device of claim 11 further comprising:
means for performing a logical AND operation on the bank enable signal and the memory array enable signal.

14. The circuit device of claim 11, further comprising:
means for performing a dual read operation.

* * * * *

UNITED STATES PATENT AND TRADEMARK OFFICE
CERTIFICATE OF CORRECTION

| | | |
|---|---|---|
| PATENT NO. | : 7,505,342 B2 | Page 1 of 1 |
| APPLICATION NO. | : 11/554522 | |
| DATED | : March 17, 2009 | |
| INVENTOR(S) | : Lin et al. | |

It is certified that error appears in the above-identified patent and that said Letters Patent is hereby corrected as shown below:

Column 14, line 28, claim 13: "claim 11 further" to read as --claim 11, further--

Signed and Sealed this
Seventh Day of June, 2011

David J. Kappos
*Director of the United States Patent and Trademark Office*